United States Patent
Ganta Papa Rao Bala et al.

(10) Patent No.: US 10,691,184 B1
(45) Date of Patent: Jun. 23, 2020

(54) HEAT SINK ASSEMBLIES HAVING REMOVABLE PORTIONS

(71) Applicant: HEWLETT PACKARD ENTERPRISE DEVELOPMENT LP, Houston, TX (US)

(72) Inventors: Sunil Rao Ganta Papa Rao Bala, Houston, TX (US); Kelly K. Smith, Houston, TX (US); Joseph Allen, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/204,846

(22) Filed: Nov. 29, 2018

(51) Int. Cl.
*G06F 1/20* (2006.01)
*G06F 1/18* (2006.01)
*H05K 7/20* (2006.01)

(52) U.S. Cl.
CPC ............. *G06F 1/20* (2013.01); *G06F 1/181* (2013.01); *H05K 7/20409* (2013.01); *H05K 7/20436* (2013.01); *H05K 7/20454* (2013.01)

(58) Field of Classification Search
CPC ..... G06F 1/20; H05K 7/2039–7/20409; H05K 7/20436–7/20454
USPC ........................................ 361/679.46, 679.54
See application file for complete search history.

(56) References Cited

U.S. PATENT DOCUMENTS

| | | | |
|---|---|---|---|
| 3,593,064 A * | 7/1971 | Wagner | H05K 7/023 361/707 |
| 5,671,120 A | 9/1997 | Kikinisi | |
| 6,365,964 B1 * | 4/2002 | Koors | H01L 23/3675 257/707 |
| 6,992,895 B2 | 1/2006 | Lindberg | |
| 7,054,153 B2 | 5/2006 | Lewis et al. | |
| 7,177,156 B2 | 2/2007 | Yatskov et al. | |
| 7,304,852 B2 * | 12/2007 | Hernandez | H05K 5/0247 174/50 |
| 7,554,805 B2 * | 6/2009 | Liu | G06F 1/20 165/104.33 |
| 7,616,437 B2 * | 11/2009 | Chang | G06F 1/20 165/104.26 |

(Continued)

FOREIGN PATENT DOCUMENTS

EP 1176706 1/2002

OTHER PUBLICATIONS

Acromag, "Acromag's New Rugged COM Express Type 6 Modules Feature Intel Core i7/i5 4th-Gen CPUs and Removable Memory," May 20, 2014. pp. 1-2 (online), Retrieved from the Internet on May 15, 2018 at URL: <prnewswire.com/news-releases/acromags-new-rugged-com-express-type-6-modules-feature-intel-core-i7i5-4th-gen-cpus-and-removable-memory-259958161>.

*Primary Examiner* — Zachary Pape
(74) *Attorney, Agent, or Firm* — Trop, Pruner & Hu, P.C.

(57) ABSTRACT

An apparatus includes a chassis; a circuit board assembly; and a heat sink assembly. The circuit board assembly includes a component to be removably installed in the connector. The heat sink assembly forms a cover for the chassis. The heat sink assembly includes a first heat sink and a second heat sink. The first heat sink is attached to the chassis, and the first heat sink includes an opening in the cover that corresponds to a location of the component. The second heat sink is to be attached to the first heat sink to close the opening and to be removable from the first heat sink to allow access to the opening to service the component.

17 Claims, 9 Drawing Sheets

(56) References Cited

U.S. PATENT DOCUMENTS

| | | | | |
|---|---|---|---|---|
| 7,724,526 | B2* | 5/2010 | Hinze | H01L 23/367 |
| | | | | 165/104.33 |
| 7,990,720 | B2* | 8/2011 | Xu | G06F 1/20 |
| | | | | 165/80.3 |
| 8,213,180 | B2* | 7/2012 | Zhao | H01L 21/4878 |
| | | | | 165/104.33 |
| 8,537,540 | B2* | 9/2013 | Landon | G06F 1/182 |
| | | | | 361/679.46 |
| 9,165,854 | B2* | 10/2015 | Chun | H01L 23/3672 |
| 9,678,546 | B2* | 6/2017 | May | G06F 1/183 |
| 2007/0211441 | A1* | 9/2007 | Wang | H05K 5/0008 |
| | | | | 361/752 |

* cited by examiner

HEAT SINK ASSEMBLIES HAVING REMOVABLE PORTIONS

BACKGROUND

A semiconductor component package (a "chip," such as a central processing unit (CPU) package, for example) may, through its operations, generate a significant amount of thermal energy, or heat. Accordingly, without the use of a heat sink, a heat exchanger, to aid in removing thermal energy from the semiconductor component package, the temperature of the package may rise outside of an optimal operating range.

A heat sink has features to facilitate the transfer of thermal energy from a semiconductor component package to the surrounding environment to regulate the temperature of the package. The heat sink may be constructed from a material that has a relatively large thermal conductivity, such as copper or aluminum, for purposes of enhancing the conduction of thermal energy from the semiconductor component package, and the heat sink may have geometrical features to enhance the transfer of thermal energy through convection to the surrounding environment. For example, the heat sink may have parallel fins that extend outwardly from a base plate of the heat sink and create a relatively large surface area to enhance the convection transfer. To thermally couple heat sink to the semiconductor component package, the heat sink may have a column, or pedestal, which extends inwardly from the base plate of the heat sink toward an outer surface of the semiconductor component package.

A deformable and thermally conductive material, called a "gap pad," may be disposed between the end surface of the pedestal and the outer surface of the semiconductor component package. The gap pad bridges a space, or gap, that exists between the end surface of the pedestal and the outer surface of the semiconductor component package. This gap may be present for purposes of accommodating stack-up tolerances that are associated with the mounting of the package and/or heat sink.

DETAILED DESCRIPTION

Figure 1:
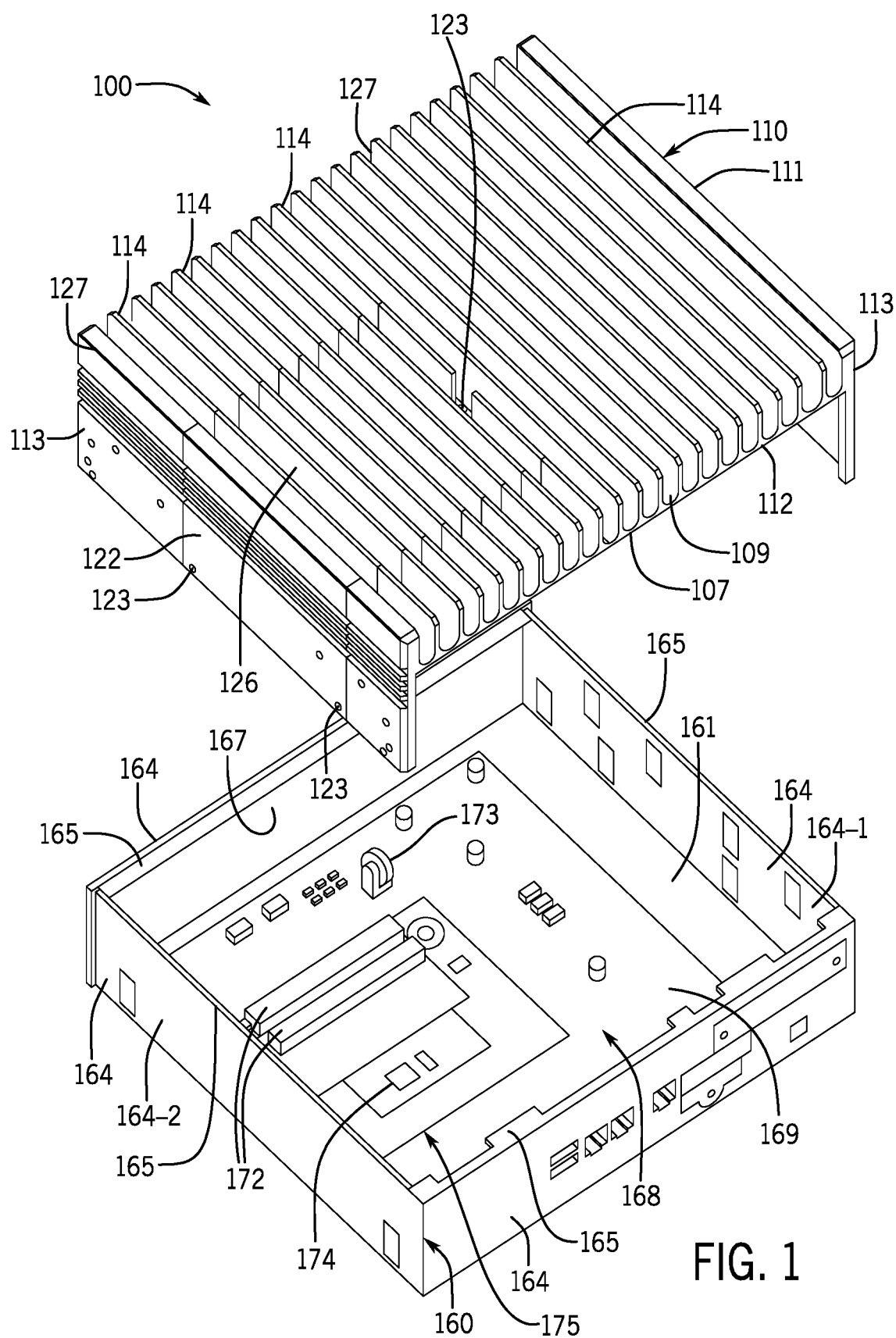
FIG. 1 is an exploded perspective view of a processor-based assembly according to an example implementation.

Some electronic products, such as gateway products, have integral heat sinks. In this context, an "integral" heat sink for an electronics product refers to the heat sink being used to form part of the housing, or enclosure, for the product. For example, the enclosure for a gateway product may be formed from a frame, or chassis, and a heat sink. The chassis may, for example, provide the bottom and sides of the enclosure, and the heat sink may be mounted to the chassis and serve as a top cover of the enclosure.

Heat dissipating circuit components of an electronics product, such as a gateway product, may rely on a heat sink to transfer thermal energy to the surrounding environment (e.g., to transfer thermal energy to the surrounding air through convection). As examples, the heat dissipating circuit components may be semiconductor packages (CPU packages, for example) and may be installed on a main circuit board (a backplane or motherboard, for example), on circuit modules (dual inline memory modules (DIMMs) or computer-on-module (COM) Express modules, as examples), on mezzanine cards (an M.2 card, for example), and so forth.

In general, the heat sink may have a base plate, parallel fins and pedestals. The fins may be integral with the base plate (where here, "integral" refers to the fins being part of the same, single piece that contains the base plate), and as such, the fins may be formed from the same thermally conductive material (e.g., copper, aluminum, a thermally conductive metal alloy, and so forth) as the base plate. The fins, via convection, transfer thermal energy that is received from the heat dissipating circuit components to the surrounding environment. The fins extend outwardly from the base plate of the heat sink and also extend longitudinally along the base plate for purposes of creating a relatively large surface area and creating spaces for sufficient air flow between fins to transfer thermal energy to the surrounding environment.

The pedestals are thermal bridges that conduct thermal energy from the heat dissipating components to the heat sink. In general, in accordance with example implementations, the pedestals are columns that are integral with the base plate and are formed form the same thermally conductive material as the base plate. The pedestals extend inwardly from the baseplate so that their end surfaces (e.g., flat surfaces) are located near corresponding heat dissipating components of the circuit board assembly. To accommodate stack up tolerances (i.e., spacing gaps between the heat sink and the circuit components due to tolerances involved with mounting the heat sink and/or circuit board assembly), the gateway product may include deformable gap pads, which extend between end surfaces of the pedestals and the corresponding heat dissipating components.

If the heat sink serves as a cover of the enclosure for the electronics product, then future upgrade options for the product may be relatively limited. At the time of purchase of the electronics product, the customer may select options to configure the build of the product based on a relatively rigid set of product specifications (communication modules, CPUs, memory components, and so forth). The customer's ability to add or change product functionality in the future may be restricted due to complexities that are involved in accessing the circuit components in the assembled electronics product. In this manner, if an integral heat sink is removed to service or upgrade a particular circuit component, the removal of the heat sink may destroy or misalign one or multiple gap pads. Replacing and realigning gap pads contribute to costs and time involved in servicing the electronics product.

In accordance with example implementations that are described herein, an integral heat sink assembly for an electronics product includes one or more removable portions, which correspond to locations of serviceable and/or upgradable circuit components of the product. Due to the ability provided by the multiple part heat sink assembly to remove a specific portion of the heat sink assembly, one or multiple service zones, or windows, are created for servicing specific components of the electronics product.

In accordance with example implementations that are described herein, the electronics product may be a processor-based assembly, i.e., a product that includes one or multiple hardware processors, such as one or multiple central processing unit (CPU) packages, one or multiple CPU cores, and so forth. As a more specific example, as further described herein the processor-based assembly may be a gateway product. In accordance with further example implementations, the electronics device may not include any processors or processor-based components.

The one or multiple removable portions of the heat sink assembly correspond to one or multiple component locations, which allows targeted replacement of one or multiple components that are disposed at a particular location. For example, if a CPU package (i.e., a "chip") of an electronics product is being serviced or upgraded, a removable portion of the heat sink assembly that corresponds to the location of the CPU package may be removed to allow access to the CPU package. This access may, for example, create sufficient space to allow a technician to remove the CPU package from its circuit board-based socket, or connector; and this access may, for example, create sufficient space to allow the technician to install another CPU package in the connector. Because the remaining portion of the heat sink assembly (other than the removed portion) is not disturbed, gap pads that correspond to other components of the circuit board assembly are not misaligned or damaged, as the heat sink pedestals that correspond to these gap pads remain in place.

As a more specific example, FIG. 1 depicts a perspective view of an electronics product, a processor-based assembly 100, in accordance with example implementations. The processor-based assembly 100 may take on numerous forms, depending on the particular application.

As an example, the processor-based assembly 100, in accordance with example implementations, may be a gateway product that may perform edge-related computing functions. For example, the gateway product may perform processing functions related to processing sensor data near the "edge" of a network where the data is acquired, as compared to, for example, performing this processing on a remotely disposed cloud-based server. As such, the gateway product may be used for, as examples, processing sensor data related to an assembly line, a molding machine tool, a camera system, and so forth, depending on the particular implementation.

The processor-based assembly 100, in general, is any electronics product that includes one or multiple processor devices (CPU(s), for example) and may be a product other than a gateway product, in accordance with further implementations.

In accordance with example implementations, the processor-based assembly 100 includes a heat sink (called a "heat sink assembly 110" herein), a circuit board assembly 168, and a chassis 160 (i.e., a frame for the assembly 100). In accordance with example implementations, the circuit board assembly 168 may be mounted to the chassis 160; and the heat sink assembly 110 may serve dual functions: the heat sink assembly 110 may enhance the removal of thermal energy from thermal energy dissipating components of the circuit board assembly 168 to the surrounding environment; and the heat sink assembly 110 may form a cover for an enclosure, or housing, for the processor-based assembly 100.

In accordance with example implementations, the heat sink assembly 110 forms a top cover for a box-like housing, or enclosure, of the processor-based assembly 100; and the bottom floor and sidewalls of the enclosure are formed from a bottom floor and sidewalls of a frame, or chassis 160. In this regard, as depicted in FIG. 1, in accordance with example implementations, the chassis 160 may be an open structure, which has a bottom floor 161 to which the circuit board assembly 168 is mounted and four sidewalls 164 that extend orthogonally from the bottom floor 161 at the floor's outer periphery. The upper edges 165 of the sidewalls 164 define an opening 167 of the chassis 160 (and opening of the enclosure); and the heat sink assembly 110, in accordance with example implementations, may be removably mounted to the sidewalls 164 to close the opening 167 to complete the enclosure.

As depicted in FIG. 1, in accordance with example implementations, the heat sink assembly 110 includes a top portion 111 that is constructed to extend across the opening 167 of the chassis 160 when the heat sink assembly 110 is mounted to the chassis 160. In accordance with example implementations, the heat sink assembly 110 may include a pair of opposing sidewalls 113 that extend orthogonally from the top portion 111; and when the heat sink assembly 110 is mounted to the chassis 160, the sidewalls 113 extend over parallel sidewalls 164 (sidewalls 164-1 and 164-2, as examples) of the chassis 160.

As depicted in FIG. 1, the top portion 111 of the heat sink assembly 110, in accordance with example implementations, includes a base plate 112 that forms a base for the heat sink assembly 110 and extends across the opening 167 of the chassis 160 when the assembly 110 is mounted to the chassis 160. In general, the base plate 112 includes an upper or externally facing surface 109 that is oriented in a direction that extends away from the circuit board assembly 168 and a lower or inwardly facing surface 107 (depicted in more detail in FIG. 4) that is oriented in a direction that extends toward the components of the circuit board assembly 168. The base plate 112 may be formed from any of a number of thermally conductive materials, such as aluminum, copper, or a thermally conductive metal alloy.

The heat sink assembly 110 may also include, as depicted in FIG. 1, parallel fins 114 that may be integral with the base plate 112. In accordance with example implementations, the fins 114 are integral with the base plate 112, constructed from the same thermally conductive material of the base plate 112, and extends outwardly from the upper surface 109 of the base plate 112. In general, the fins 114 extend longitudinally along the base plate 112 for purposes of creating an enhanced surface area for transferring thermal energy to the surrounding environment (e.g., the surrounding air) via thermal convection.

In accordance with example implementations, the circuit board assembly 168 includes various thermal energy dissipating components that, due to their operations, produce thermal energy. Energy dissipated by these components, in accordance with example implementations, is transferred to the heat sink assembly 110 through conduction, and the heat sink assembly 110 transfers this thermal energy to the surrounding environment via convection.

In accordance with some implementations, the heat sink assembly 110 is a passive heat sink, in that the fins 114 are disposed on the outside of the enclosure for the processor-based assembly 100, and the processor-based assembly 100 does not include any forced air-typed devices, such as a fan, to assist in the removal of thermal energy from the heat sink assembly 110.

In accordance with some implementations, the circuit board assembly 168 includes a main circuit board 169 (a motherboard or backplane, as examples) that is mounted to the floor of the chassis 160 (via standoffs and fasteners, such as machine screws, for example). Heat dissipating components and non-heat dissipating components may be installed directly or indirectly on the main circuit board 169. In accordance with example implementations, some of these components may be mounted to the main circuit board 169 via a more permanent type of mounting, such as soldered connection in which the external terminals or pads of the components are soldered to traces of the circuit board 169. Other of these components may be directly or indirectly mounted to the main circuit board 169 via a removable mounting, such as a mounting in which the external terminals or pads of the components are inserted into a slot connector or socket, which has, for example, spring-like electrical contacts.

In this context, "direct" mounting to the main circuit board 169 means that the component is mounted to the circuit board 169 without an intervening circuit board being between the component and the circuit board 169. "Indirect" mounting refers to the component being mounted to a first circuit board other than the main circuit board and this first circuit board being directly or indirectly mounted to the main circuit board 169. Thus, as an example, a heat dissipating component may be a semiconductor component package that is installed in a connector or socket on the main circuit board 169. As another example, a heat dissipating component may be a semiconductor component package that is installed in a connector or socket in another circuit board assembly, and this other circuit board assembly may be installed in the main circuit board 169. As examples, the other circuit board assembly may be a mezzanine circuit card that is installed in a slot connector of the main circuit board 169 or a module that installed in connector or socket of the main circuit board 169.

As a more specific example, in accordance with some implementations, a computer-on-module (COM) Express module 175 may be installed in a connector or socket on the main circuit board 169; and the COM Express module 175 may include such heat dissipating components one or multiple CPU packages 174 and one or multiple memory modules 172.

As another example, in accordance with some implementations, an M.2. module may be installed in a connector or slot on the main circuit board. The M.2 module may, for example, be a communication interface or function as a solid state drive (SSD). The M.2 module may contain memory components that dissipate heat.

In accordance with example implementations, the processor-based assembly 100 may include one or multiple non-heat dissipating components, which, in general, do not rely on the heat sink assembly 110 to remove thermal energy from the components. For example, in accordance with some implementations, the processor-based assembly 100 may include a Complementary Metal-Oxide-Semiconductor (CMOS) battery 173, which may be mounted in a battery holder on the main circuit board 169. The CMOS battery 173 may, in general, be used to supply a voltage to maintain data that is stored in a volatile memory of the processor-based assembly 100, such as, for example, data representing a time of day or configuration settings for the assembly 100.

As depicted in FIG. 1, the heat sink assembly 110 includes heat sink parts, or portions, that may be separated from each other for purposes of servicing and/or replacing components that are directly or indirectly mounted to the main circuit board 169: a main heat sink portion 127 that is constructed to remain secured to the chassis 160 during component servicing and/or replacement; and one or multiple removable heat sink portions 126 that may be removed from the main heat sink portion 127 of the heat sink assembly 110 during component servicing and/or replacement. Although FIG. 1 depicts a single, removable heat sink portion 126, a heat sink assembly, in accordance with further example implementations, may include multiple heat sink removable portions, as described further herein.

The removable heat sink portion 126, when removed from the main heat sink portion 127 of the assembly 110, opens a space that allows a targeted, location specific access to one or multiple components of the processor-based assembly 100. For the specific implementation that is depicted in FIG. 1, removal of the removable heat sink portion 126 allows access to components of the COM Express module 175, such as the CPU package 174 and the memory modules 172.

Due to the select, targeted access provided by the removable heat sink portion 126, gap pads (not depicted in FIG. 1) that correspond to components of the circuit board assembly 168 other than the components of the COM Express module 175 may be left intact, when the removable heat sink portion 126 is removed. This allows a user to incorporate features in the COM Express module 175 in the future (after the product is built and delivered to the customer) without locking the user into a feature specific configuration at the time of purchase of the processor-based assembly 100. Moreover, the components of the COM Express module 175 may be upgraded and/or serviced without unplugging the COM Express module 175 from the main circuit board 169 or removing the module 175 from the assembly 100. Therefore, for example, a first CPU package 174 may be installed in the processor-based assembly 100 at the time of delivery to the end customer. At a later time, the customer may upgrade the first CPU package 174 with a second, higher performance CPU package 174 by removing the removable heat sink portion 126; removing the first CPU package 174 from its socket on the circuit board assembly 168; installing the second CPU package 174 in the socket; replacing and/or realigning a gap pad (further described herein) corresponding to the second CPU package 174; and remounting the removable heat sink portion 126 to the main heat sink portion 127.

In accordance with example implementations, the removable 126 and main 127 heat sink portions of the heat sink assembly 110 are individual heat sinks: each heat sink portion 126, 127 includes a subset, or portion, of the base plate 112 and each portion 126, 127 includes subsets, or portions, of the fins 114 of the overall heat sink assembly 110. Moreover, as depicted in FIG. 1, in accordance with example implementations, the removable heat sink portion 126 may contain a sidewall part 122 of the sidewall 164-2 of the heat sink assembly 110. Therefore, when the removable heat sink portion 126 is removed, part of the top and part of the side of the heat sink assembly 110 are removed, thereby creating both top and side access regions for servicing or upgrading components of the COM Express module 175 (for the example implementation of FIG. 1) or other components.

Figure 2:
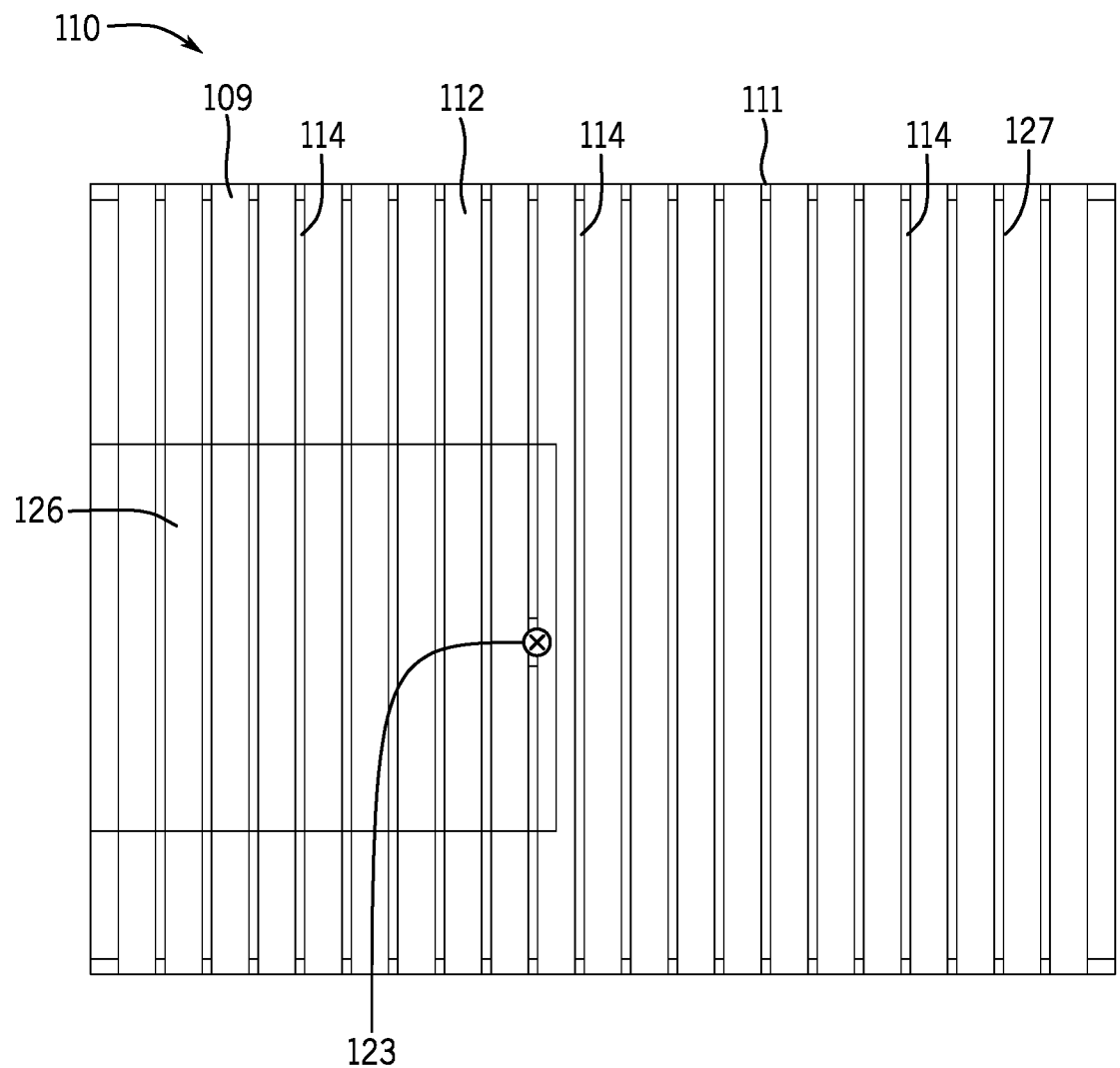
FIG. 2 is a top view of a heat sink assembly of FIG. 1 according to an example implementation.

As depicted in FIG. 1, in accordance with some implementations, the removable heat sink portion 126 may be secured to the main heat sink portion 127 of the heat sink assembly 110 via removable fasteners 123, such as threaded machine screws that extend through openings of the heat sink assembly 110 into corresponding threaded holes of the chassis 160. More specifically, referring to FIG. 2 (showing a top view of the heat sink assembly 110) in conjunction with FIG. 1, in accordance with example implementations, one or multiple fasteners 123 may, for example, attach the sidewall part 122 of the removable portion 126 to the main portion 127 of the heat sink assembly 110; and one or multiple fasteners 123 may attach the top portion of the removable portion 126 to the main portion 127 of the heat sink assembly 110.

Figure 3:
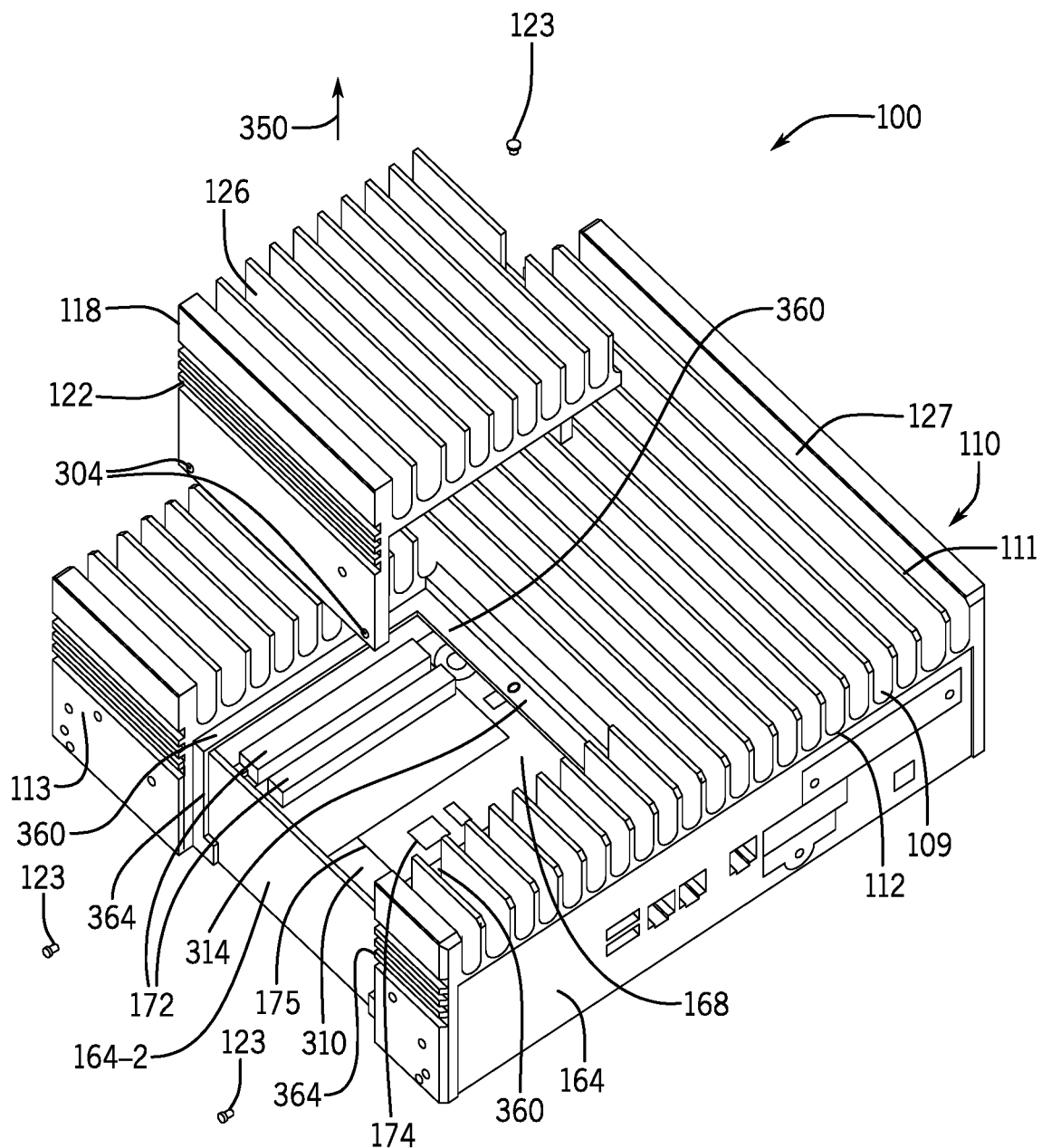
FIG. 3 is a perspective view of the processor-based assembly of FIG. 1 illustrating removal of a portion of the heat sink assembly to allow access to circuit board components according to an example implementation.

FIG. 3 is an exploded perspective view of the processor-based assembly 100, depicting the removal of the removable heat sink portion 126 (in an upward direction 350) from the main heat sink portion 127 of the heat sink assembly 110 in accordance with example implementations. As depicted in the example implementation of FIG. 3, two side fasteners 123 and one top fastener 123 have been removed. With the removable heat sink portion 126 being removed, a corresponding service zone, or window 310, is established in the main heat sink portion 127 (which remains secured or fastened to the chassis 160) to allow corresponding access to the components of the COM Express module 175.

Moreover, as depicted in FIG. 3, in accordance with some implementations, the opening 310 in the main portion 127 is partially circumscribed by a recessed peripheral area, or flange 314, of the main portion 127. In accordance with example implementations, the flange 314 is constructed to form a seat to receive a mating bottom surface of the removable portion 126 to allow rigid mating of the heat sink portions 126 and 127 as well as enhance the thermal coupling of the portions 126 and 127 together when the removable heat sink portion 126 is placed within the window 310 and secured via the fasteners 123.

As depicted in FIG. 3, in accordance with an example implementation, opening 310 may be rectangular, the flange 314 may have segments 360 and 364 that contact the main heat sink portion 127 when the removable heat sink portion 126 is mounted the portion 127. More specifically, as depicted in FIG. 3, three segments 360 of the flange 314 circumscribe three corresponding peripheral edges of the opening 310 to contact the upper part of the removable heat sink 126; and two segments 364 of the flange 310 extend along the sidewall 164-2 of the chassis 160 to contact the sidewall part 122 of the removable heat sink portion 126.

The flange feature may have one or more of the following advantages. The flange 314 allows the removable 126 and main 127 heat sink portions to be mechanically secured together. The flange 314 allows the removable 126 and main 127 heat sink portions to be thermally coupled together so that when the fasteners 123 are installed, the portions 126 and 127 contact at the flange 314 to effectively form a single heat sink from the two portions 126 and 127.

Figure 4:
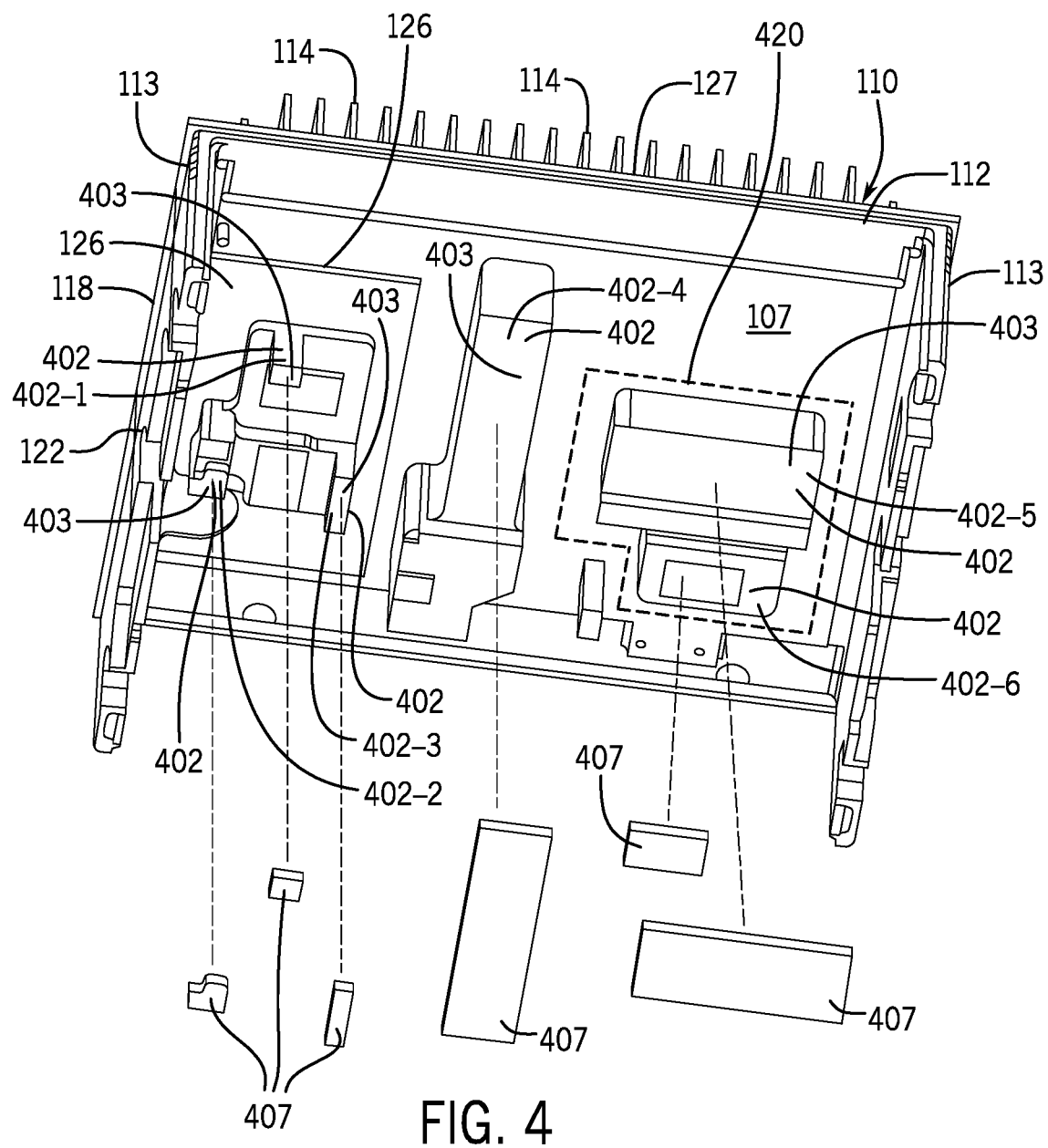
FIG. 4 is an exploded perspective view of the heat sink assembly illustrating pedestals and gap pads according to an example implementation.

Referring to FIG. 4 in conjunction with FIG. 1, in accordance with some implementations, the heat sink assembly 110 includes one or multiple pedestals 402 (six example pedestals 402-1, 402-2, 402-3, 402-4, 402-5 and 402-6 being depicted in FIG. 4). In accordance with example implementations, the pedestals 402 may be integral with the base plate 112 and may be formed from the same thermally conductive material as the base plate 112. In accordance with example implementations, the pedestals 402 extend orthogonally inwardly from the base plate 112 toward the components of the circuit board assembly 168 for purposes of conducting thermal energy from these components to the heat sink assembly 110. For example, pedestal 402-5 and 402-6 may extend to contact power dissipating components of the COM Express module 175; and pedestals 402-1, 402-2, 402-3 and 402-4 may, for example, extend to power dissipating components of the circuit board assembly 168 that are not located on the COM Express module 175.

As depicted in FIG. 4, in accordance with example implementations, the processor-based 110 may have gap pads 407, which have a one-to-one correspondence with the pedestals 402. In this manner, in accordance with example implementations, each gap pad 407 may extend between an end surface 403 (e.g., a flat end surface) of a corresponding pedestal 402 to form a deformable thermal bridge between the pedestal 402 and a corresponding component of the circuit board assembly 168. In general, the gap pads 407 accommodate stack-up tolerances to ensure sufficient thermal contacts between the thermal dissipating components of the circuit board assembly 168 and the corresponding pedestals 402.

For the specific example that is depicted in FIG. 4, the removable heat sink portion 126 corresponds to the COM Express module 175, and as such, the removal of the removable heat sink portion 126 corresponds to gap pads 407 associated with the components and corresponding to pedestals 402-5 and 402-6. Because the removable heat sink portion 126 targets the portion of the heat sink assembly 110 associated with the COM Express module 175, gap pads 404 that are not associated with the COM Express module 175, such as example gap pads 407 that correspond to the pedestals 402-1, 402-2, 402-3 and 402-4 are left undisturbed when the removable heat sink portion 126 is removed.

Figure 5:
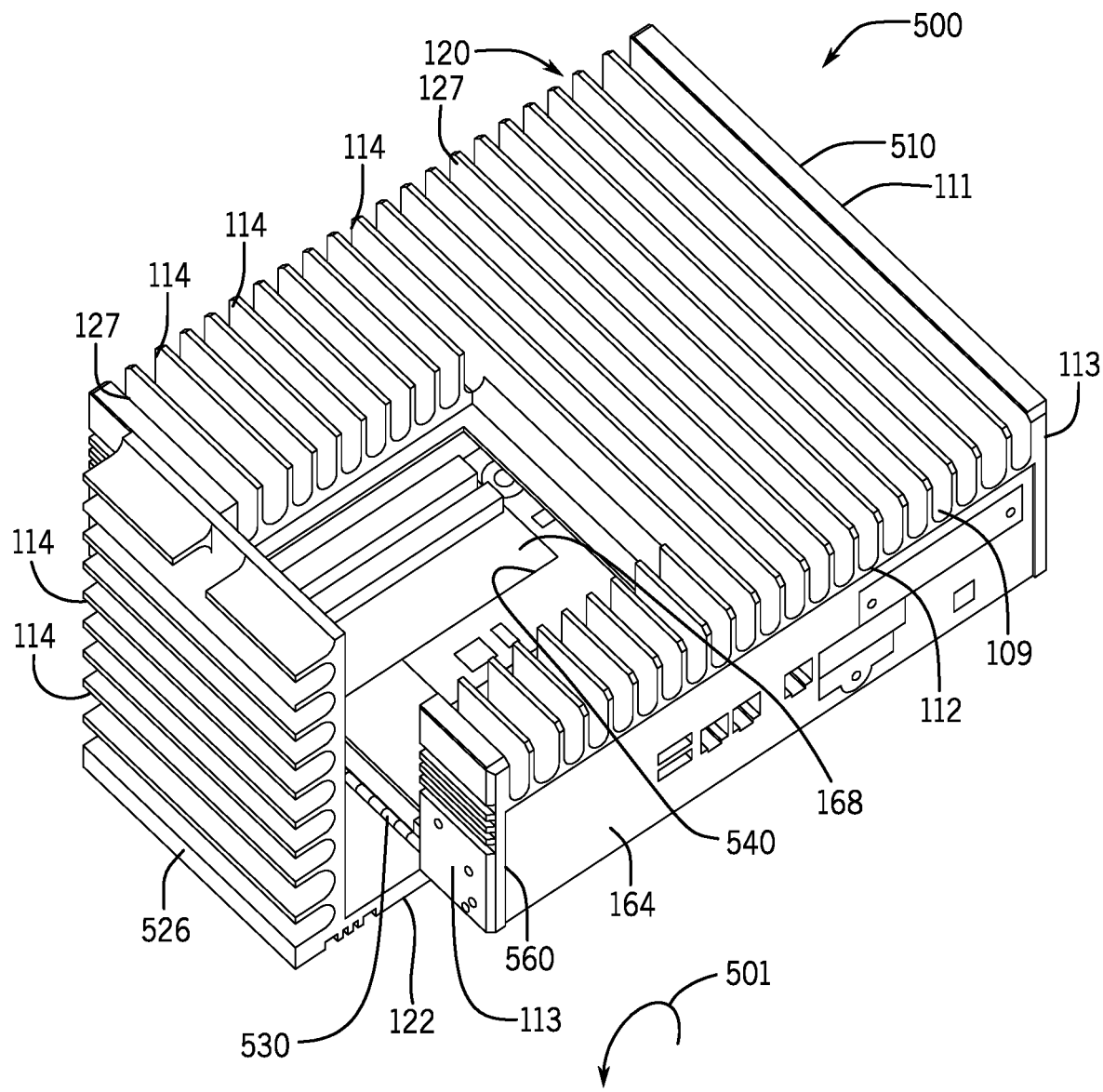
FIG. 5 is an exploded perspective view of a processor-based assembly depicting a portion of the heat sink assembly being pivoted open to allow access to circuit board components according to a further example implementation.

Referring to FIG. 5, in accordance with further example implementations, a heat sink (called a "heat assembly 510") of a processor-based assembly 500 may be used in place of the heat sink assembly 100. In general, the heat sink assembly 510 has a similar design to the heat sink assembly 110 (see FIG. 1), with the same reference numerals being used to depict similar components. However, unlike the heat sink assembly 110, the heat sink assembly 510 has one or multiple removable L-shaped heat sink portions 526 that may be pivoted open to establish corresponding service windows to service and/or replace corresponding components of the circuit board assembly 168. In this manner, referring to FIG. 5 in conjunction with FIG. 1, instead of being attached to the main heat sink portion 127 via fasteners 123, the removable heat portion 526 (which replaces the removable heat sink portion 126 of the assembly 110 for the example implementation depicted in FIG. 5) is attached to the chassis 160 via a hinge connection 530. The hinge connection 530 constrains the removable heat sink portion 526 to pivot about an axis of the hinge connection 520. Thus, the removable heat sink portion 526 may be rotated, or pivoted, as depicted at reference numeral 501, to open access to component(s) of the circuit board assembly 168 and pivoted in the opposite direction to close access.

In accordance with example implementations, a chassis 560 of the processor-based assembly 500 may have the same general features of the chassis 160 (FIG. 1), except that for the chassis 506, a corresponding portion of the sidewall 164-2 has been removed, as the removed portion is closed when the removable portion 526 is closed. The removed sidewall portion allows enhanced access when the removable heat sink portion 526 is pivoted open. A top fastener (not shown) may be used to secure the removable heat sink portion 526 in its closed position to the main heat sink portion 127; and the removable heat sink portion 526 may be pivoted about the axis of the hinge connection 530 to expose part of the underlying circuit board assembly 168.

Thus, in accordance with example implementations, a heat sink assembly includes one or multiple removable heat sink portions; and a given removable heat sink portion may be removed by entirely separating the portion from the main portion of the heat sink assembly (as depicted in FIG. 3) or removed by pivoting the removable portion to the side (as depicted in FIG. 5.)

The pivotable coupling of the removable heat sink portion 526 to the main portion 127, the ability to pivot the removable heat sink portion 526 between open and closed positions, and the removable heat sink portion 526 being formed from top and side portions of the heat sink assembly 110 may provide one or multiple of the following advantages. A targeted access port is created to access a selected component without destroying or misaligning gap pads that are not associated with the component. An expanded access region is created for servicing and/or replacing a given circuit board assembly component. The time involved in accessing a component is decreased due to the use of a fewer number of fasteners (as compared to the heat sink assembly 110 of FIG. 1, for example) to secure the removable portion 526 to the main portion 127.

Figure 6A:
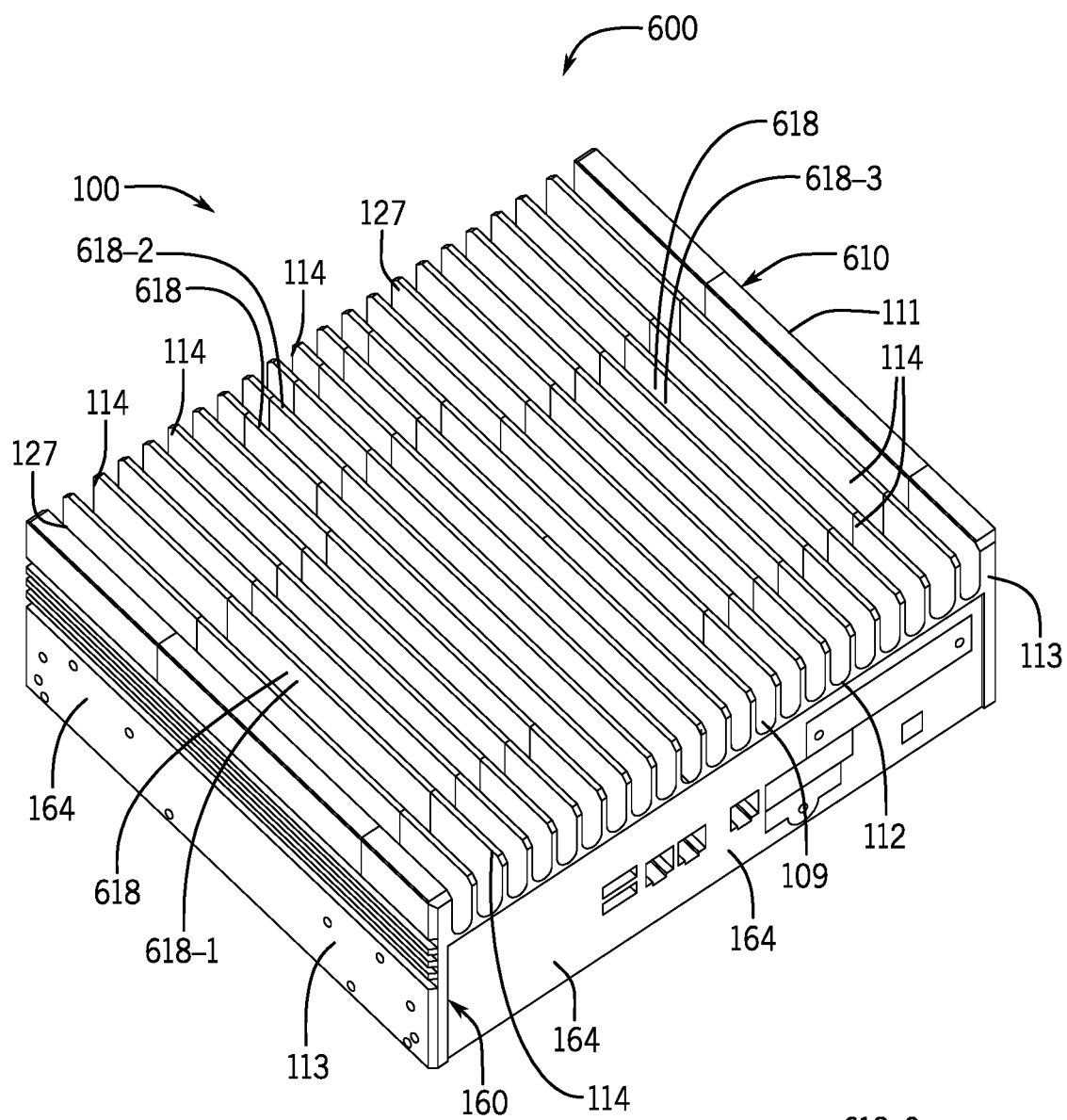
FIG. 6A is a perspective view of a processor-based assembly having a heat sink assembly with multiple removable portions to provide multiple service windows for accessing circuit board components according to a further example implementation.

Referring to FIG. 6A, in accordance with further example implementations, a heat sink assembly 610 (of a processor-based assembly 600) may be used in place of the heat sink assembly 110 (FIG. 1) or heat sink assembly 510 (FIG. 5). The heat sink assembly 610, in general, has a similar design to the heat sink assemblies 110 (FIG. 1) and 510 (FIG. 5), with the same reference numerals being used to denote similar components. However, unlike the heat sink assemblies 110 and 510, the main heat sink portion 127 of the heat assembly 610 has multiple openings that receive multiple removable heat sink portions 618 (for example, removable portions 618-1, 618-2 and 618-3 being depicted in FIG. 6). As such, the heat sink assembly 610 allows multiple, specific windows, or zones, for servicing components of the circuit board assembly 168 in that the particular component or components associated with a given removable portion 610 may be accessed by removing the portion 610 without disturbing the gap pads for other components of the circuit board assembly 168.

Although removable heat sink portions are described herein for purposes of servicing components that may be thermally coupled to the heat sink assembly 110, in accordance with further example implementations, a particular heat sink portion may be removed for purposes of servicing a component of the printed circuit board assembly 168 that is not thermally coupled to the heat sink assembly 110. For example, referring to FIG. 6A, a particular removable heat sink portion 618-2 of the heat sink assembly 610 may be removed to service or replace a non-heat dissipating component, such as the CMOS battery 173 (see FIG. 1).

Figure 6B:
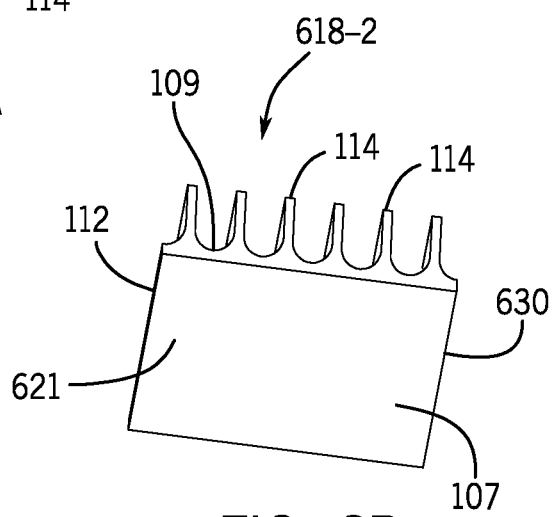
FIG. 6B is a bottom up perspective view of a removable portion of the heat sink assembly of FIG. 6A corresponding to a non-heat dissipating component according to an example implementation.

Referring to FIG. 6B in conjunction with FIG. 6A, the removable heat sink portion 618-2 does not have any pedestals 402 (FIG. 4). In other words, the portion of the inwardly facing base plate surface 107 that is formed by the removable heat sink portion 618-2 may be planar surface region (i.e., a region that lies substantially in a plane), in accordance with example implementation. Thus, unlike a region 420 (see FIG. 4) of the base plate surface 107 that contains pedestals 402, for the removable heat sink portion 618-2, the outer periphery 630 of the removable portion 618-2 circumscribes part of the surface 107, which has no pedestals 402 (i.e., circumscribes a portion of the base plate 112 that is planar), The removable heat sink portion 618-3 does not have any pedestals, as the CMOS battery 173 does not rely on the heat sink assembly 110 to remove heat from the CMOS battery 173. Therefore, no gap pads (such as the gap pads 407 that are depicted in FIG. 4) may be destroyed or misaligned when the CMOS battery 173 is replaced, in accordance with example implementations.

Due to the correspondence of the location of the CMOS battery 173 to the removable portion 618-3, a particular service zone, or window, is created for purposes of allowing the CMOS battery 173 to be periodically replaced without disturbing gap pads. Thus, components, such as the CMOS battery 174, which have finite lifetimes, may be replaced over the life time of the processing-based system without disturbing heat sink gap pads.

Other implementations are contemplated, which are within the scope of the appended claims. For example, although heat sink assemblies are described herein as being of processor-based assemblies, in accordance with further example implementations, a heat sink assembly similar to the heat sink assemblies that are described herein, may be used with an electronics product that does not any include processors. Moreover, although heat sink assemblies are described herein that include removable heat sink portions that are either hinged or non-hinged, in accordance with further example implementations, a heat sink assembly may include one or multiple hinged, removable heat sink portions (e.g., the removable heat sink portion 526 of FIG. 5) and one or multiple non-hinged removable heat sink portions (e.g., the removable heat sink portion 126 of FIG. 1). As another example, in accordance with some implementations, a heat sink assembly may have a pivoting, removable portion that is disposed in its entirely on the top or side of the chassis. As yet another example, in accordance with some implementations, heat sink assembly may have a removable portion that does not have any pedestals (e.g., removable heat sink portion 618-2 of FIG. 6A), with the portion being connected by a hinge to the chassis 160 and/or with the portion having an L-shape and extending over a sidewall of the chassis 160.

Figure 7:
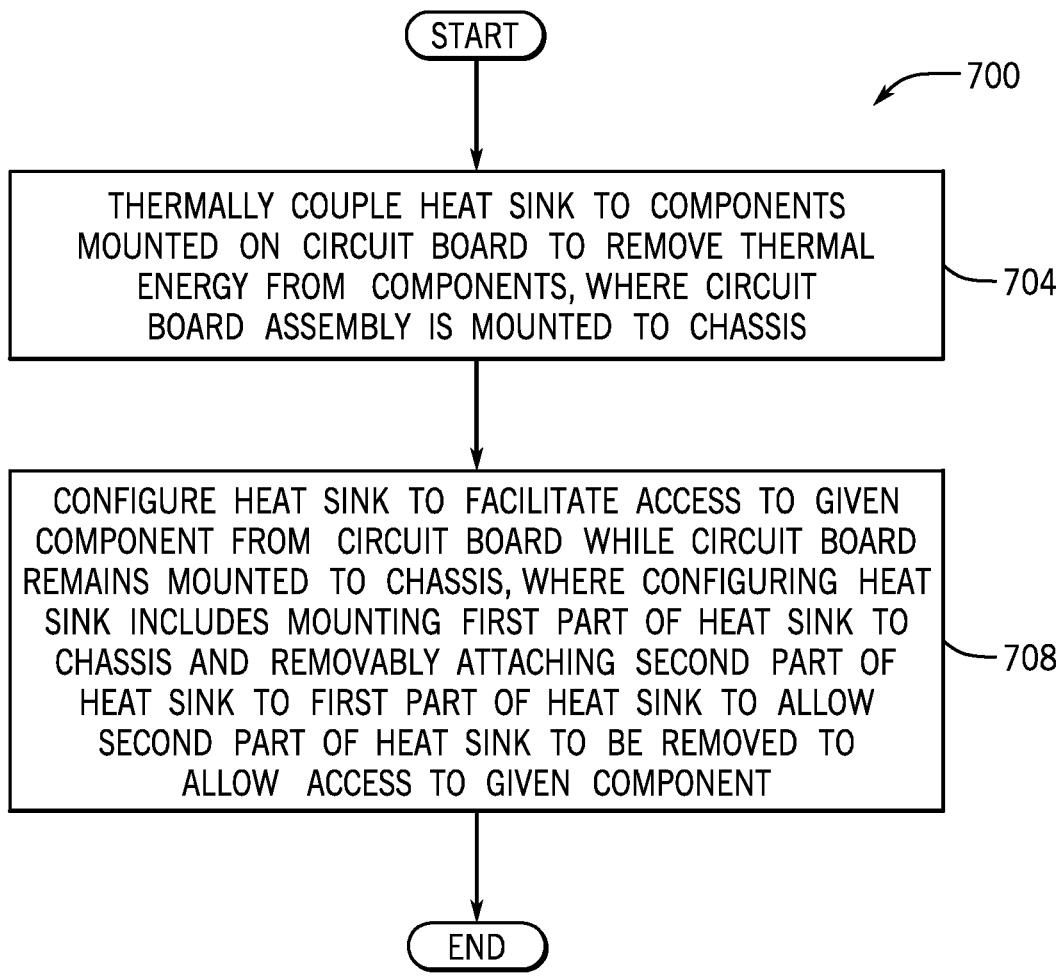
FIG. 7 is a flow diagram depicting a technique to configure a heat sink to facilitate access to a component mounted on a circuit board according to an example implementation.

Thus, referring to FIG. 7, in accordance with example implementations, a technique 700 includes thermally coupling (block 704) a heat sink to components that are mounted on a circuit board to remove thermal energy from the components. The circuit board assembly is mounted to a chassis. The technique 708 includes configuring (block 708) the heat sink to facilitate access to a given component while the circuit board remains mounted to the chassis. Configuring the heat sink includes mounting a first part of the heat sink to the chassis; and removably attaching a second part of the heat sink to the first part of the heat sink to allow the second part of the heat sink to be removed to allow access to the given component.

Figure 8:
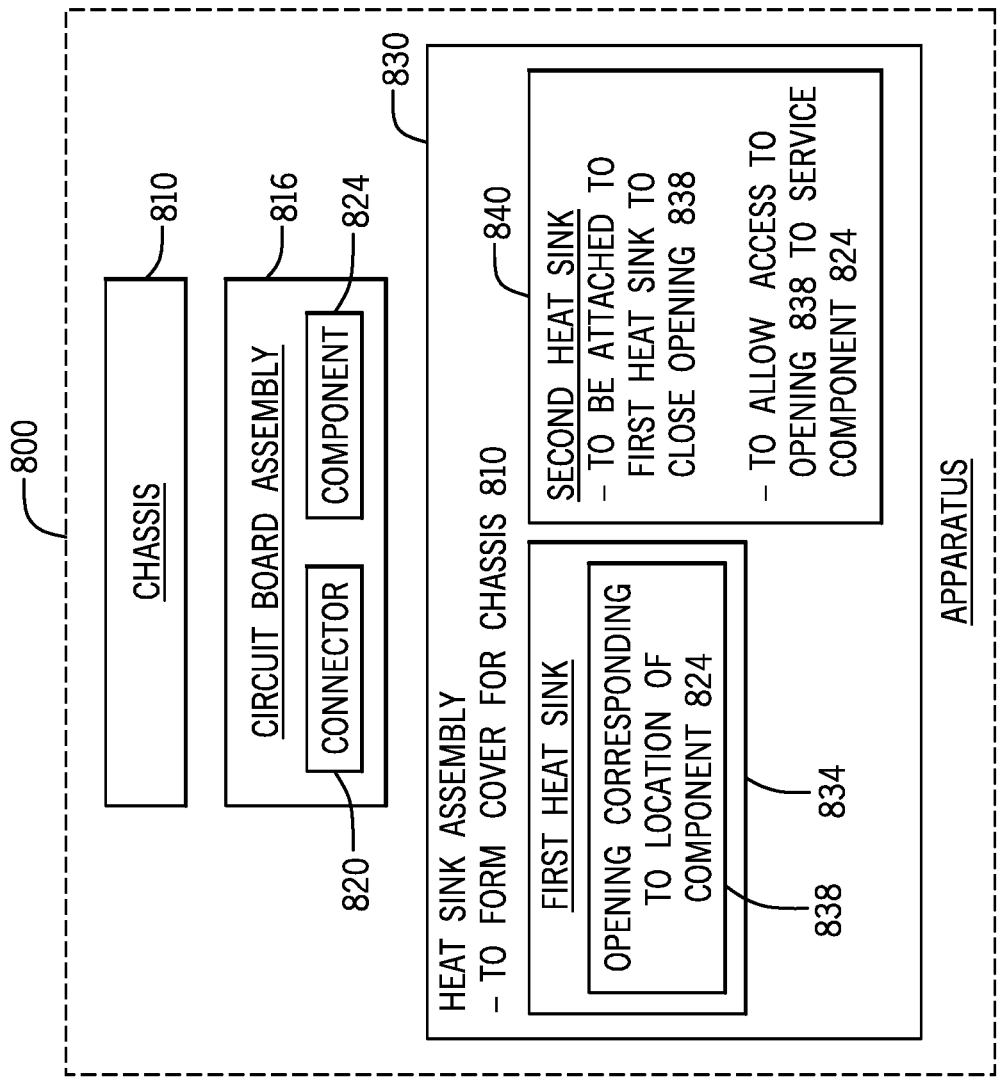
FIG. 8 is a schematic diagram of an apparatus that includes a heat sink assembly that forms a cover for a chassis and includes a removable heat sink according to an example implementation.

Referring to FIG. 8, in accordance with example implementations, an apparatus 800 includes a chassis 810; a circuit board assembly 816; and a heat sink assembly 830. The circuit board assembly 816 includes a connector 820 and a component 824 that is to be removably installed in the connector 820. The heat sink assembly 830 is to form a cover for the chassis 810. The heat sink assembly 830 includes a first heat sink 834 that is attached to the chassis 810. The first heat sink 834 includes an opening 838 in the cover corresponding to a location of the component 824. The second heat sink assembly 830 includes a second heat sink 840 to be attached to the first heat sink 834 to close the opening and to be removable from the first heat sink 834 to allow access to the opening to service the component 824.

Figure 9:
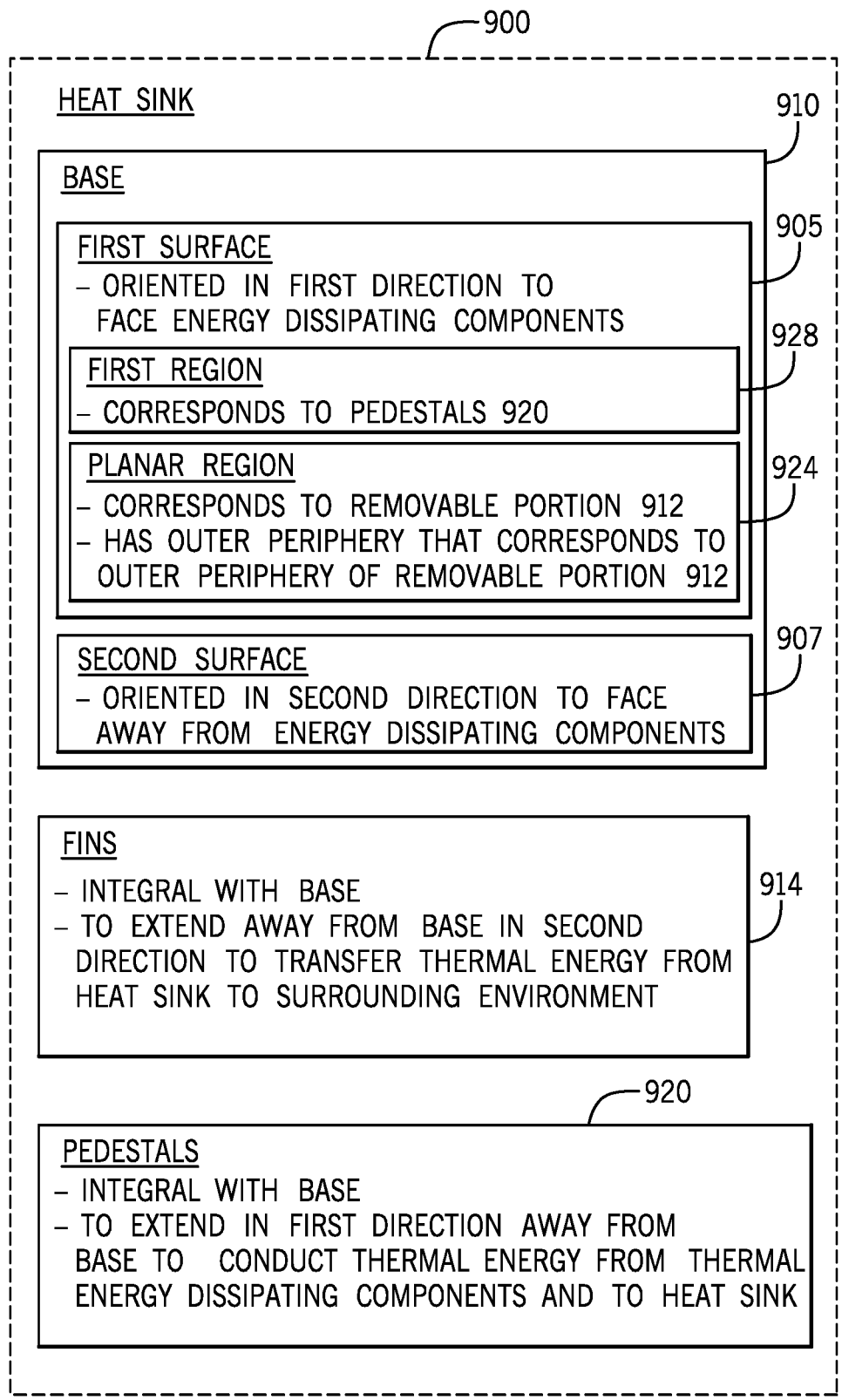
FIG. 9 is a schematic diagram of a heat sink that includes a base having a removable portion according to an example implementation.

Referring to FIG. 9, a heat sink 900 includes a base 910; a plurality of fins 914 that are integral with the base 910; and a plurality of pedestals 920 that are integral with the base 910. The base 910 includes a removable portion 912. A first surface 905 of the base 910 is oriented in a first direction to face energy dissipating components, and a second surface 907 of the base 910 is oriented in a second direction to face away from the energy dissipating components. The fins 914 extend away from the base 910 in the second direction to transfer thermal energy from the heat sink 900 to a surrounding environment. The pedestals 920 extend away from the base 910 in the first direction to conduct thermal energy from thermally energy dissipating components. The first surface 905 includes a first region 928 that corresponds to the pedestals 920 and a planar region 924 that corresponds to the removable portion 912 of the base 910. The planar region 924 has an outer periphery that corresponds to an outer periphery of the removable portion 912.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
   a chassis;
   a circuit board assembly comprising a connector configured to receive a first component removably installed in the connector; and
   a heat sink assembly attached to the chassis such that the heat sink assembly and chassis form an enclosure that houses the circuit board with the heat sink assembly forming a cover of the enclosure, wherein the heat sink assembly comprises:
      a first heat sink attached to the chassis, wherein the first heat sink comprises an opening that, when unclosed, allows access to the first component and a pedestal that thermally couples a second component of the circuit board assembly to the first heat sink; and
      a second heat sink to be secured relative to the first heat sink and to engage the first heat sink such that the second heat sink closes the opening, wherein the second heat sink can be disengaged from the first heat sink such that the opening is unclosed, wherein comprises a second pedestal that is located such that, when the second heat sink is engaging the first heat sink at the opening, the second pedestal is above the installed location of the first component.

2. The apparatus of claim 1, wherein the heat sink assembly further comprises a hinge to enable the second heat sink to pivot relative to the first heat sink.

3. The apparatus of claim 2, wherein pivoting the second heat sink in a first direction causes the second heat sink to engage the first heat sink and close the opening and pivoting the second heat sink in a second direction causes the second heat sink to disengage the first heat sink such that the opening is unclosed.

4. The apparatus of claim 2, wherein:
   the second heat sink comprises a sidewall portion and a top portion;
   the opening is defined by a sidewall portion of the first heat sink and a top portion of the first heat sink; and
   the heat sink to pivot about the hinge in a first direction to close the opening and to pivot about the hinge in a second direction to allow side and top access to the component.

5. The apparatus of claim 1, wherein:
   the first heat sink comprises a flange to circumscribe the opening; and
   the second heat sink engaging the first heat sink includes the second heat sink mounting to the flange such that the first heat sink and the second heat sink are thermally coupled together via the flange.

6. The apparatus of claim 1, further comprising a gap pad disposed between the pedestal and the second component.

7. The apparatus of claim 1, wherein the pedestal is integral with a base plate of the first heat sink.

8. A method comprising:
   providing the apparatus of claim 1;
      with the second heat sink disengaged from the first heat sink such that the opening is unclosed, causing the second heat sink to engage the first heat sink such that the second heat sink closes the opening.

9. The method of claim 8, wherein the causing the second heat sink to engage the first heat sink includes rotating the second heat sink about a hinge.

10. A method comprising:
    providing the apparatus of claim 1;
       with the second heat sink engaged with the first heat sink such that the second heat sink closes the opening, causing the second heat sink to disengage from the first heat sink such that the opening is unclosed.

11. The method of claim 10, wherein the causing the second heat sink to disengage from the first heat sink includes rotating the second heat sink about a hinge.

12. A heat sink to form a cover of an enclosure, the heat sink comprising:
    a first part comprising
       a base to attach to a chassis, the base comprising an opening,
       a plurality of fins integral with the base and extending away from a first side of the base in a first direction;
       a plurality of pedestals integral with the base and extending away from the base in a second direction;
    a second part comprising
       a second base that is to engage with the first base to close the opening, wherein the second base can be removed from the opening such that the opening is exposed, and the second base includes a pedestal integral with the second base; and
       a second plurality of fins integral with the second base.

13. The heat sink of claim 12, wherein:
    the first base comprises a flange extending around an outer periphery of the opening; and
    the second base is to engage with the first base to close the opening by mounting to the flange, the flange thermally coupling the first part to the second part.

14. The heat sink of claim 12, further comprising a hinge connection to pivotably couple the second base to the first base.

15. The heat sink of claim 12, wherein the second base comprises an L-shaped portion.

16. A method comprising:
attaching a first part of a heat sink to a chassis and thermally coupling the first part of the heat sink to one or more components mounted on the circuit board assembly, wherein the circuit board assembly is mounted to the chassis, the heat sink and chassis form an enclosure that houses the circuit board with the heat sink forming a cover of the enclosure, and the first part of the heat sink has an opening that, when unclosed, allows access to the circuit board assembly, wherein the first part of the heat sink is integral with a plurality of pedestals that extend away from the first part; and removably securing a second part of the heat sink relative to the first part of the heat sink and engaging the second part of the heat sink with the first part of the heat sink such that the second part of the heat sink closes the opening, wherein the second part is capable of being disengaged from the first heat sink such that the opening is unclosed, wherein the second part of the heat sink is integral with a plurality of pedestals.

17. The method of claim 16, removably securing the second part of the heat sink relative to the first part of the heat sink includes rotating the second part about a hinge.

* * * * *